(12) United States Patent
Schneider

(10) Patent No.: US 7,381,970 B2
(45) Date of Patent: Jun. 3, 2008

(54) SPECIMEN STAGE FOR CHARGED-PARTICLE SCANNING MICROSCOPY

(76) Inventor: Summer Schneider, Hewlett-Packard Co., 1000 NE. Circle Blvd., Corvallis, OR (US) 97330

( * ) Notice: Subject to any disclaimer, the term of this patent is extended or adjusted under 35 U.S.C. 154(b) by 550 days.

(21) Appl. No.: 11/047,979

(22) Filed: Jan. 31, 2005

(65) Prior Publication Data

US 2006/0169916 A1   Aug. 3, 2006

(51) Int. Cl.
  *G21K 5/10* (2006.01)
(52) U.S. Cl. .......... 250/442.11; 250/306; 250/307; 250/309; 250/310
(58) Field of Classification Search .......... 250/440.11, 250/306–443.1
See application file for complete search history.

(56) References Cited

U.S. PATENT DOCUMENTS

| | | | |
|---|---|---|---|
| 4,179,609 A | 12/1979 | Sewell et al. | |
| 4,350,866 A * | 9/1982 | Zasio et al. .......... | 438/466 |
| 4,627,009 A | 12/1986 | Holmes et al. | |
| 5,923,040 A | 7/1999 | Carroll | |
| 6,184,533 B1 | 2/2001 | Shirai et al. | |
| 6,414,322 B1 | 7/2002 | Carroll | |
| 6,452,174 B1 * | 9/2002 | Hirose et al. .......... | 250/309 |
| 6,614,244 B2 | 9/2003 | Yamada et al. | |
| 6,693,284 B2 | 2/2004 | Tanaka | |
| 6,762,416 B2 | 7/2004 | Carroll | |
| 6,777,678 B1 | 8/2004 | Vanderlinde | |
| 6,791,095 B2 | 9/2004 | Pan et al. | |
| 6,809,319 B2 | 10/2004 | Sohda et al. | |
| 2003/0146761 A1 * | 8/2003 | Pakdaman et al. .......... | 324/501 |
| 2004/0046120 A1 | 3/2004 | Moses et al. | |
| 2004/0164244 A1 | 8/2004 | Takashi et al. | |

* cited by examiner

*Primary Examiner*—Jack I. Berman
*Assistant Examiner*—Andrew Smyth

(57) ABSTRACT

A specimen stage for charged-particle scanning microscopy comprises a non-magnetic platform for supporting a specimen, at least one probe pin assembly including a probe pin for contacting a selected portion of the specimen, the probe pin being electrically insulated from the platform and being electrically coupled to an output, and an elevator mechanism operable to move the platform for bringing the specimen into and out of electrical contact with the probe pin(s), substantially without moving the probe pin(s).

22 Claims, 3 Drawing Sheets

SPECIMEN STAGE FOR CHARGED-PARTICLE SCANNING MICROSCOPY

TECHNICAL FIELD

This invention relates generally to specimen stages for charged-particle microscopy.

BACKGROUND

Charged-particle scanning microscopy has become a very important tool for examination of specimens having microscopic-scale and/or nanoscale features. Scanning electron microscopy is a versatile form of charged-particle scanning microscopy that is extensively used in the biological sciences and in physical sciences and technology, especially in microelectronics development and manufacturing. The utility and versatility of a scanning electron microscope (SEM) arises in part from the various modes of image formation that an SEM can employ, such as secondary electron emission, Auger electron emission, backscattered electron contrast, cathodoluminescence, characteristic X-ray emission, and electron-bean induced current (EPIC). Several of these modes are susceptible to interference by magnetic fields that may be present in the vicinity of a specimen being examined. In microelectronics development and manufacturing, the SEM is often used for defect and yield analysis of semiconductor integrated circuits.

Specimens to be examined in an SEM are often mounted on conductive specimen stubs, e.g., with conductive paste. Such electrical contact to a specimen mounted on such a stub may be required to prevent charging of the specimen during scanning with the electron beam or other charged-particle beam. Some modes of using SEM's require at least one electrical contact in addition to back side contact to a stub. The electron-beam induced current (EPIC) mode is such a mode.

Various special-purpose stages have been developed for use in SEM's and other charged-particle-beam instruments, such as electron-beam and ion-beam lithography systems. For example, special-purpose stages have been made for heating specimens, for cooling specimens to low temperatures, for tensile-strength testing in an SEM, for wet specimens, for scanning transmission electron microscopy (STEM), for combination SEM and scanning probe microscopy, etc.

Using a charged-particle-beam scanning instrument such as an SEM for defect and yield analysis of semiconductor integrated circuits in microelectronics development and manufacturing, for example, often requires examination of multiple specimens in electron-beam induced current (EPIC) mode. As each new specimen has been introduced into the instrument, it has been necessary to re-position electrical contacts on the new specimen, a time-consuming process that is sometimes difficult to perform reproducibly so that various specimens will be examined with equivalent corresponding electrical-contact arrangements. Thus, there is a need for a specimen stage that allows fast, convenient, and repeatable specimen exchanges with repeatable electrical contacts in a charged-particle-beam scanning instrument.

BRIEF DESCRIPTION OF THE DRAWINGS

The features and advantages of the disclosure will readily be appreciated by persons skilled in the art from the following detailed description when read in conjunction with the drawings, wherein.

DETAILED DESCRIPTION OF EMBODIMENTS

Figure 1:
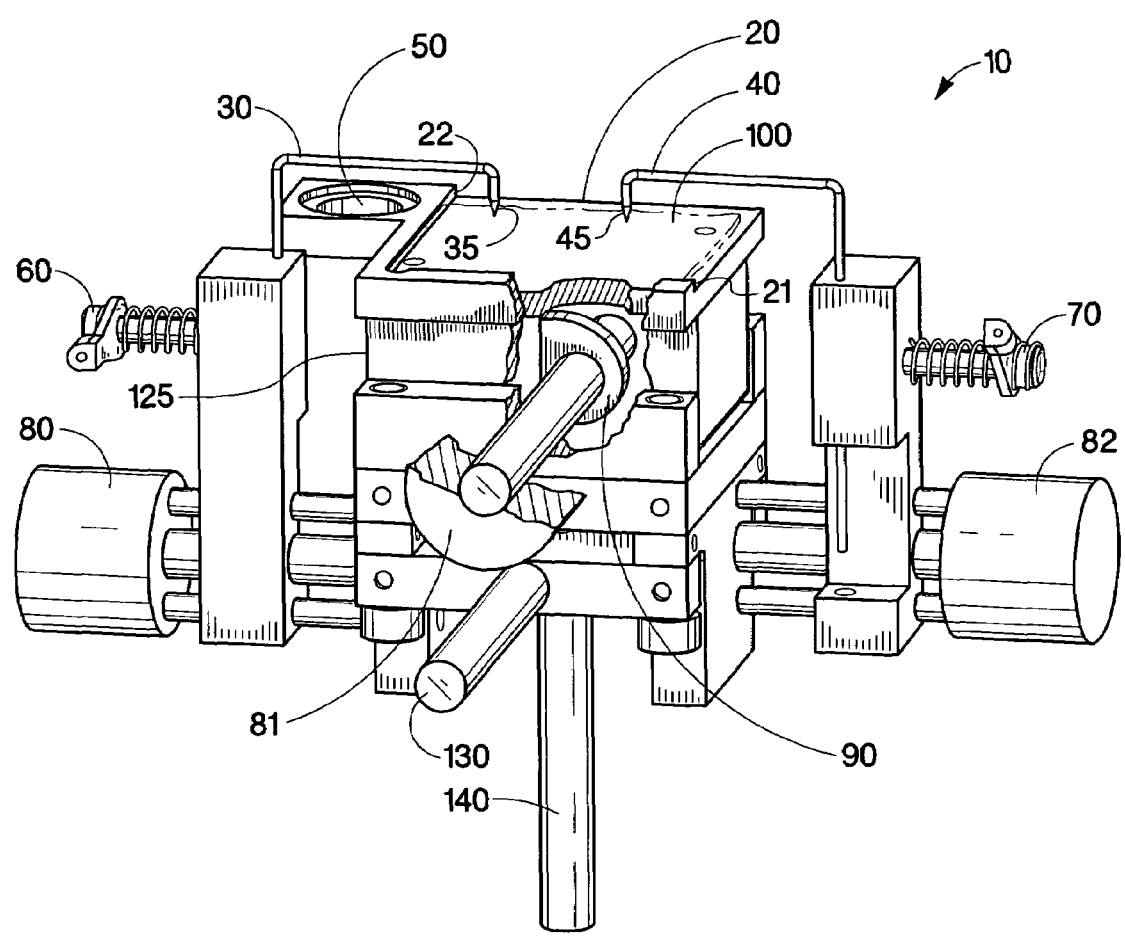
FIG. 1 is a partially cutaway perspective view of an embodiment of a specimen stage.

For clarity of the description, the drawings are not necessarily drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the invention can be positioned in a number of different orientations, the directional terminology is used for purposes of illustration and is in no way limiting.

One aspect of the invention provides embodiments of a specimen stage assembly 10 for charged-particle scanning microscopy, comprising a non-magnetic platform 20 for supporting a specimen, at least one probe pin assembly including a conductive probe pin 30 with a tip 35 for contacting a selected portion of the specimen (the probe pin being electrically insulated from the platform and being electrically coupled to an output, e.g., for display of a current), and an elevator mechanism 25 operable to move the platform for bringing the specimen into contact and out of contact with the tip(s) 35 of probe pin(s) 30, substantially without moving the probe pin(s) 30.

Embodiments of the entire specimen stage assembly are adapted to be used in a vacuum environment. Thus, to avoid specimen contamination and/or to avoid scattering of charged particles by gas molecules, for example, the materials of the specimen stage assembly should not outgas and the assembly should not have blind holes that can trap gas.

Figure 2:
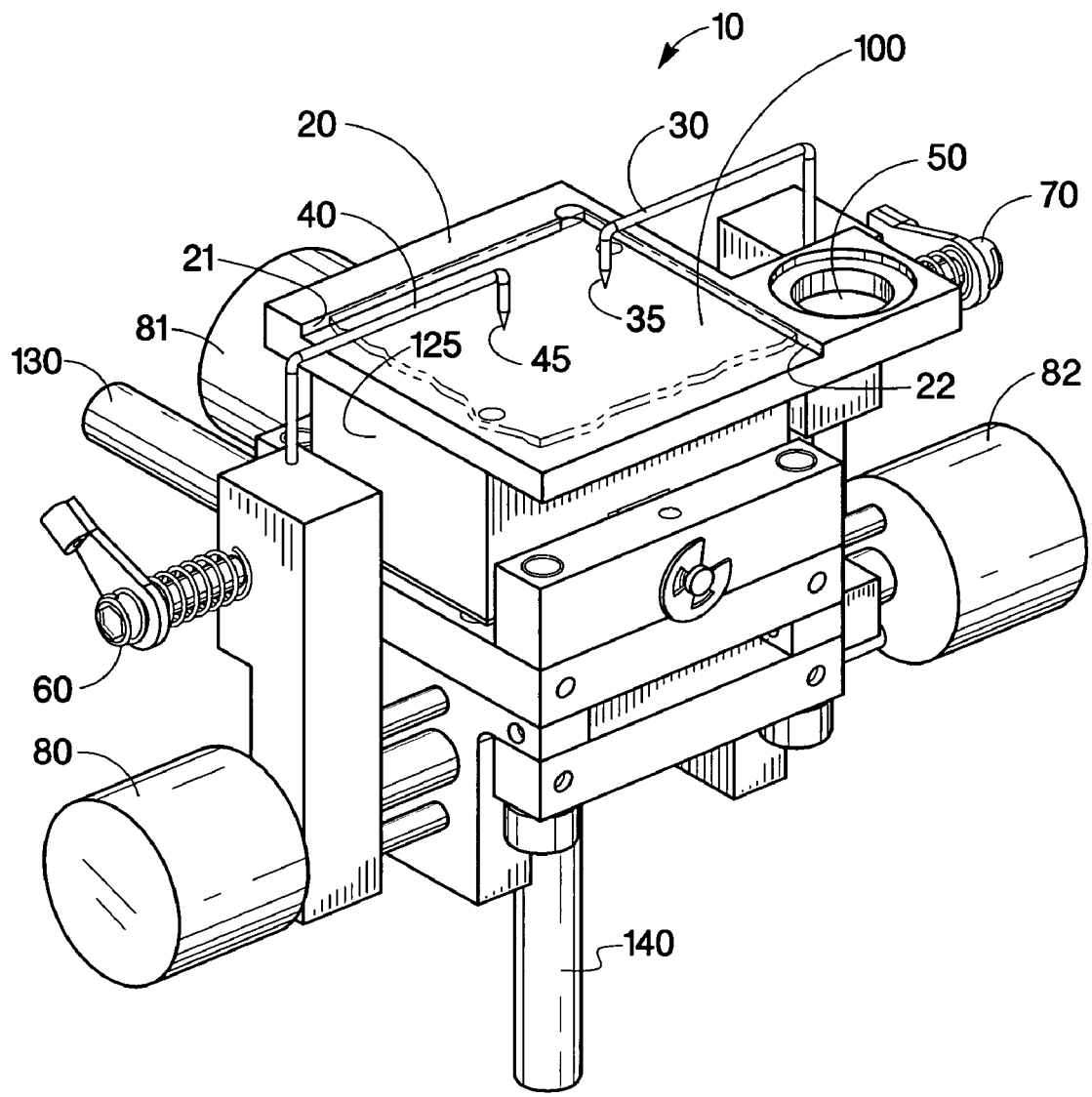
FIG. 2 is another perspective view of an embodiment of a specimen stage.
Figure 3:
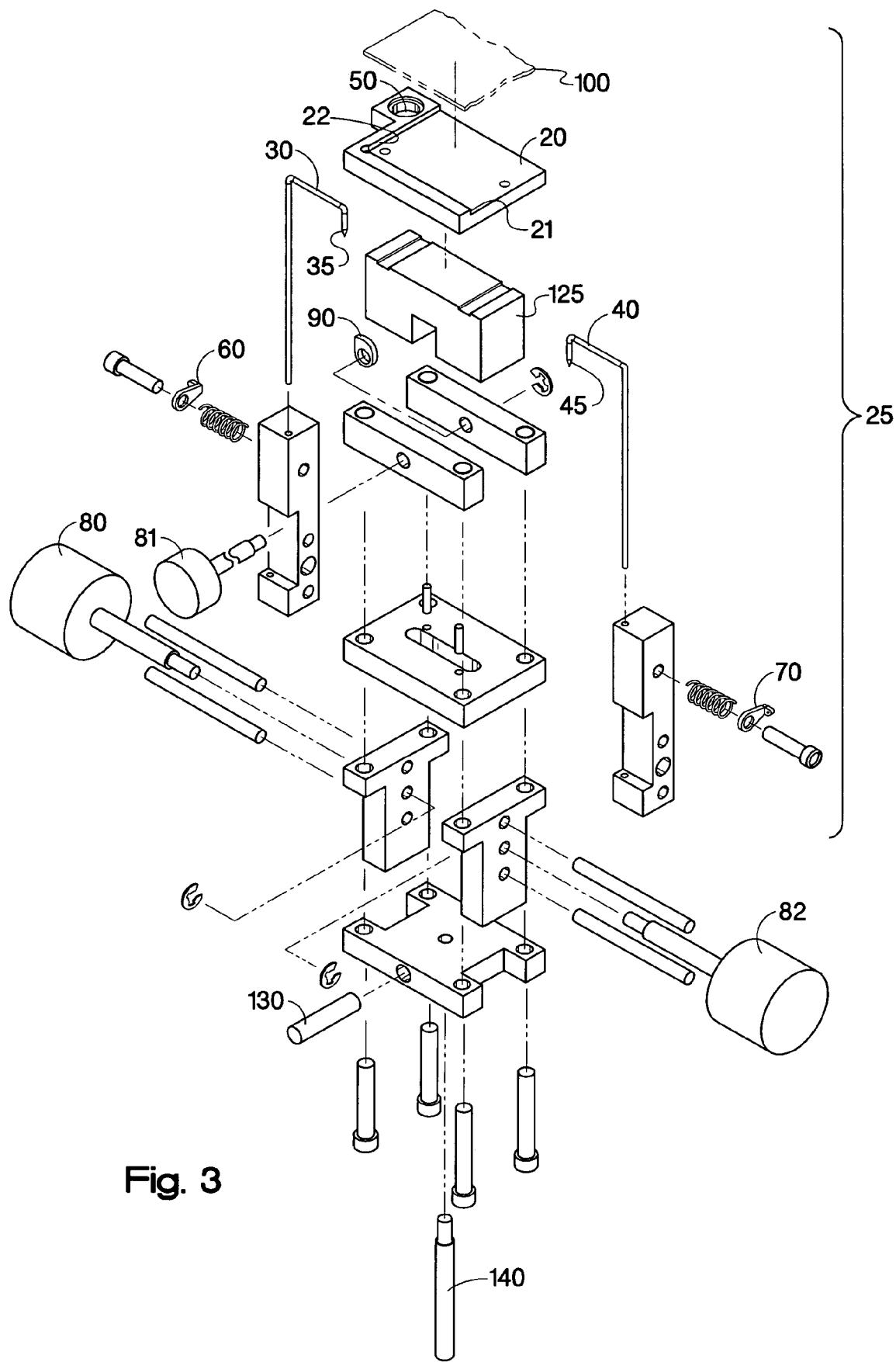
FIG. 3 is an exploded view of an embodiment of a specimen stage.

FIG. 1 is a partially cutaway perspective view of an embodiment of a specimen stage. FIG. 2 is another perspective view of a specimen stage embodiment like that of FIG. 1, from a different point of view. FIG. 3 is an exploded view of an embodiment like the embodiments shown in FIGS. 1 and 2.

As illustrated by the embodiments shown in FIGS. 1, 2, and 3, the specimen stage assembly 10 has a platform 20 for supporting and holding a specimen 100 (shown in phantom—specimen 100 is not part of the present invention). Platform 20 is disposed where a specimen held on its top surface may be scanned by a charged-particle beam, i.e., facing an electron-optics column that provides a scanning charged-particle beam. Platform 20 may be made of a non-magnetic material such as copper or brass to avoid magnetic fields being introduced by the platform into the vicinity of the specimen. Platform 20 also has specimen alignment features 21 and 22, allowing repeatable placement of various similar specimens 100 in the same position on the platform. In the embodiments shown in FIGS. 1, 2, and 3, alignment features 21 and 22 are linear raised portions disposed along two orthogonal directions on platform 20. Two edges of each new specimen are registered against features 21 and 22. Pins, bosses, detents, or other alignment features may be substituted for features 21 and 22 as shown.

An elevator subassembly 25 is adapted to move platform 20 vertically within a range including the normal focusing range of the scanning charged-particle beam (including the beam's depth of focus). More details of this motion are described hereinbelow.

Specimen stage assembly 10 also includes at least one probe pin assembly 30. The probe pin assembly 30 is electrically insulated from platform 20 and is electrically coupled to an output (not shown), e.g., for detection and/or display of a current.

The embodiments illustrated in FIGS. 1-3 have two separate conductive probe pin assemblies 30 and 40, which may be manipulated independently from one another. These embodiments include a spring-loaded adjustor 60 for probe pin assembly 30 and a similar spring-loaded adjustor 70 for probe pin assembly 40.

Probe pin assembly 30 has a sharp probe tip 35 facing specimen 100, and probe pin assembly 40 has a sharp probe tip 45 facing specimen 100.

Specimen stage assembly 10 may also include a Faraday cup 50. Faraday cup 50 is used in a conventional manner to collect beam current of the charged-particle beam, e.g., for calibration of the beam current. In the embodiments shown in FIGS. 1, 2, and 3, Faraday cup 50 is an integral part of platform 20, and thus may also comprise a non-magnetic material such as copper or brass. The disposition of Faraday cup 50 on platform 20 of specimen stage assembly 10 should be such that vertically the Faraday cup is in substantially the same plane as the top surface of specimen 100 and horizontally the Faraday cup is accessible to the charged-particle beam when platform 20 is within its normal range of horizontal motion. Placing the Faraday cup 50 in substantially the same plane as the top surface of specimen 100 allows current collection and calibration to be performed substantially without re-focusing the charged-particle beam.

In use of specimen stage assembly 10, probe pin assemblies 30 and 40 may be adjusted by manipulating adjustors 60 and 70 so that probe tips 35 and 45 respectively contact selected points on the surface of a first specimen 100. When examination of the first specimen (and each subsequent specimen 100) is completed, probe tips 35 and 45 are left in place. Elevator subassembly 25 is actuated (downward in the drawings) to move platform 20 and the specimen 100 that it carries away from probe tips 35 and 45 without moving the probe tips. The specimen 100 that has been examined is then removed from platform 20 and replaced with a new specimen 100, placed in the same location on platform 20 by using specimen alignment features 21 and 22. Elevator subassembly 25 is actuated (upward in the drawings) to move platform 20 and the specimen 100 toward probe tips 35 and 45 until the specimen contacts the probe tips. The sequence of moving platform 20 away, replacing specimen 100, and moving platform 20 toward the probe tips is repeated for each new specimen, as many times as necessary. Maintaining the probe tips stationary at fixed positions enables repeatable positioning of the probe tips on different specimens, which are repeatably positioned on platform 20.

Each probe pin has a tip (35, 45) with an axis, and the tip axes of all the probe pin tips are substantially parallel. The elevator mechanism 25 moves the platform 20 linearly in a direction parallel to the tip axes.

The cutaway portion of FIG. 1 shows how platform 20 is moved by elevator subassembly 25 in the embodiment illustrated. In use of elevator subassembly 25, a cam 90 is maintained in contact with a block 125 to which platform 20 is rigidly mounted. When cam 90 is rotated by using a thumbwheel 81, platform 20 may thus be moved linearly up and down. In the embodiments shown, cam 90 bears against a horizontal surface inside a recess formed in the bottom of block 125. Contact of that horizontal surface with cam 90 may be maintained by gravity, or alternatively by springs or other equivalent means.

Other thumbwheels 80 and 82 move platform 20 horizontally along two orthogonal axes to position specimen 100 horizontally with respect to the scan field of the charged-particle beam. Each of the thumbwheels 80, 81, and 82 may be replaced by a suitable bidirectional motor, such as a stepping motor. The motors may be controlled by external signals. The external signals to control these motors may be provided by a computer (not shown), e.g., a programmable general purpose computer or a computer specifically adapted for the task.

Mounting elements 130 and 140 allow the entire specimen stage 10 to be oriented in various alternative orientations with respect to the charged-particle scanning beam column. This flexibility is useful, for example, in allowing examination of a cross section of a specimen, e.g., at a cleaved edge of a semiconductor device.

Thus, such embodiments of a specimen stage for charged-particle scanning microscopy include a platform for supporting a specimen. The platform comprises a non-magnetic material, and the platform is disposed for scanning of the specimen by a beam of charged particles. The specimen stage also includes at least one conductive probe pin assembly, including a probe pin with a probe tip for contacting a selected portion of the specimen, the probe pin being electrically insulated from the platform and being electrically coupled to an output, e.g., for display of a current. The specimen stage also includes an elevator mechanism operable to move the platform for bringing the specimen into contact and out of contact with the probe tip, substantially without moving the probe tip.

The specimen stage may also include a second probe pin assembly including a second probe pin for contacting a second selected portion of the specimen. The second probe pin is similar to the first probe pin in being electrically insulated from the platform and being electrically coupled to a second output, e.g., for display of a current. Any number of such probe pin assemblies may be provided.

Each probe pin has a tip, and the tips of the probe pins are disposed equidistantly from the platform. Therefore, motion of the platform for bringing the specimen into and out of contact with the probe pins provides for substantially simultaneous contact of the specimen with all probe tips, substantially without moving the probe pins. When there are multiple probe pins, the tips of the probe pins are all disposed to be substantially coplanar, and the plane in which the probe-pin tips are disposed is parallel to the platform.

The probe pin assemblies may be modular, with each probe pin assembly being independently removable from the specimen stage and replaceable by a substantially identical probe pin assembly.

A specimen-stage embodiment especially suitable for electron-beam induced current (EPIC) work or for work with other charged-particle-beam induced current has a platform for supporting a specimen, the platform comprising a non-magnetic material and being disposed for scanning of the specimen by a beam of charged particles, and including an integral Faraday cup for collection of charged-particle-beam current. This embodiment has a multiplicity of probe pin assemblies. Each probe pin assembly includes a probe pin tip for contacting a selected portion of the specimen; each probe pin is electrically insulated from the platform; and each probe pin is electrically coupled to an output, e.g., for display of a current. The probe pin tips are all disposed to be substantially coplanar in a plane parallel to the platform. An elevator mechanism is operable to move the platform for bringing the specimen into contact simultaneously with all the probe pins, substantially without moving the probe pins. Similarly, the elevator mechanism is operable to move the platform for bringing the specimen out of contact with the probe pins, substantially without moving the probe pins. The contact of probe pin tips with the specimen may be electrical contact as well as mechanical and/or thermal contact.

INDUSTRIAL APPLICABILITY

Specimen stages made in accordance with the invention are useful in scanning electron microscopy, transmission electron microscopy, scanning transmission electron microscopy, scanning optical microscopy, and various modes of scanning probe microscopy. Although specific features are adapted for electron-beam induced current (EPIC) the specimen stages may be used with other contrast mechanisms, such as backscattered electrons, secondary electrons, characteristic X-ray emission, etc. The specimen stages may also be used in various applications outside the field of microscopy, such as charged-particle lithography or microbiology.

Although the foregoing has been a description and illustration of specific embodiments of the invention, various modifications and changes thereto can be made by persons skilled in the art without departing from the scope and spirit of the invention as defined by the following claims. For example, functionally equivalent materials may be substituted for materials described herein. Also, functionally equivalent mechanisms may be adapted to perform some of the functions. For example, to move platform 20, a rack-and-pinion drive, a lever arrangement, or another equivalent mechanism may be used instead of cam 90.

What is claimed is:

1. A specimen stage for charged-particle scanning microscopy and the like, comprising:
   a) a platform for supporting a specimen, the platform comprising a non-magnetic material, and the platform being disposed for scanning of the specimen by a beam of charged particles;
   b) at least one probe pin assembly including a probe pin for contacting a selected portion of the specimen, the probe pin being electrically insulated from the platform and being electrically coupled to an output; and
   c) an elevator mechanism operable to move the platform for bringing the specimen into and out of electrical contact with the probe pin, substantially without moving the probe pin.

2. The specimen stage of claim 1, wherein the probe pin has a probe pin tip having an axis, and the elevator mechanism is adapted to move the platform linearly in a direction parallel to the axis of the probe pin tip.

3. The specimen stage of claim 1, further comprising at least a second probe pin assembly including a second probe pin for contacting a second selected portion of the specimen, the second probe pin being electrically insulated from the platform and being electrically coupled to a second output.

4. The specimen stage of claim 3, wherein the second probe pin has a second-probe-pin tip having an axis, and the elevator mechanism is adapted to move the platform linearly in a direction parallel to the axis of the second probe pin tip.

5. The specimen stage of claim 3, wherein each of the first and second probe pins has a tip, and the tips of the probe pins are disposed to maintain equal distances from the platform, whereby motion of the platform for bringing the specimen into and out of electrical contact with the first and second probe pins may provide for substantially simultaneous contact with both probe tips, substantially without moving the probe pins.

6. The specimen stage of claim 1, comprising a multiplicity of probe pin assemblies, each probe pin assembly including a probe pin for contacting a selected portion of the specimen, each probe pin being electrically insulated from the platform and each probe pin being electrically coupled to an output.

7. The specimen stage of claim 6, wherein each probe pin of the multiplicity of probe pin assemblies has a tip, and the tips of the probe pins are all disposed to be substantially coplanar.

8. The specimen stage of claim 7, wherein the plane in which the tips of the probe pins are disposed is parallel to the platform.

9. The specimen stage of claim 6, wherein each probe pin of the multiplicity of probe pin assemblies has a tip having a tip axis, the tip axes of all the probe pins are substantially parallel, and the elevator mechanism is adapted to move the platform linearly in a direction parallel to the tip axes.

10. The specimen stage of claim 6, wherein the multiplicity of probe pin assemblies are modular, each probe pin assembly being independently removable from the specimen stage.

11. The specimen stage of claim 1, further comprising a Faraday cup for collection of charged-particle-beam current.

12. The specimen stage of claim 11, wherein the Faraday cup comprises a non-magnetic material.

13. The specimen stage of claim 11, wherein the Faraday cup is disposed on the platform.

14. The specimen stage of claim 11, wherein the Faraday cup is integral with the platform.

15. The specimen stage of claim 1, wherein the elevator mechanism includes a cam adapted to move the platform.

16. The specimen stage of claim 1, wherein the non-magnetic material of the platform comprises a material selected from the list consisting of copper and its non-magnetic alloys.

17. A specimen stage for charged-particle scanning microscopy and the like, comprising:
   a) a platform for supporting a specimen, the platform being disposed for scanning of the specimen by a beam of charged particles, the platform comprising a non-magnetic material, and the platform including an integral Faraday cup for collection of charged-particle-beam current;
   b) a multiplicity of probe pin assemblies, each probe pin assembly including a probe pin for contacting a selected portion of the specimen, each probe pin being electrically insulated from the platform and each probe pin being electrically coupled to an output, each probe pin of the multiplicity of probe pin assemblies having a tip, and the tips of the probe pins all being disposed to be substantially coplanar in a plane parallel to the platform; and
   c) an elevator mechanism operable to move the platform for bringing the specimen into and out of electrical contact with the probe pins simultaneously, substantially without moving the probe pins.

18. The specimen stage of claim 17, wherein the multiplicity of probe pin assemblies are modular, each probe pin assembly being independently removable from the specimen stage.

19. The specimen stage of claim 17, wherein the elevator mechanism includes a cam adapted to move the platform.

20. A specimen stage for charged-particle scanning microscopy and the like, comprising:
   a) means for supporting a specimen, the supporting means comprising a non-magnetic material, and the supporting means being disposed for scanning of the specimen by a beam of charged particles;
   b) means for contacting at least one selected portion of the specimen, the contacting means being electrically insulated from the supporting means and being electrically coupled to output means; and
   c) means for moving the supporting means for bringing the specimen into and out of electrical contact with the contacting means, substantially without moving the contacting means.

21. The specimen stage of claim 20, wherein the means for contacting has a contacting-means axis, and the means for moving is adapted to move the supporting means linearly in a direction parallel to the contacting-means axis of the means for contacting.

22. A specimen stage for charged-particle scanning microscopy and the like, comprising:
   a) a platform for supporting a specimen, the platform being disposed for scanning of the specimen by a beam of charged particles, the platform comprising a non-magnetic material, and the platform including an integral Faraday cup for collection of charged-particle-beam current;
   b) a multiplicity of probe pin assemblies, each probe pin assembly including a probe pin for contacting a selected portion of the specimen, each probe pin being electrically insulated from the platform and each probe pin being electrically coupled to an output, each probe pin of the multiplicity of probe pin assemblies having a tip, and the tips of the probe pins all being disposed to be substantially coplanar in a plane parallel to the platform, each probe pin tip having a probe tip axis, wherein all the probe tip axes are substantially parallel to each other; and
   c) an elevator mechanism operable to move the platform along a direction substantially parallel to all the probe tip axes for bringing the specimen into and out of electrical contact with all the probe pins simultaneously, substantially without moving the probe pins.

* * * * *

UNITED STATES PATENT AND TRADEMARK OFFICE
CERTIFICATE OF CORRECTION

| | | |
|---|---|---|
| PATENT NO. | : 7,381,970 B2 | Page 1 of 1 |
| APPLICATION NO. | : 11/047979 | |
| DATED | : June 3, 2008 | |
| INVENTOR(S) | : Summer Schneider | |

It is certified that error appears in the above-identified patent and that said Letters Patent is hereby corrected as shown below:

In column 1, line 24, delete "(EPIC)" and insert -- (EBIC) --, therefor.

In column 1, line 37, delete "(EPIC)" and insert -- (EBIC) --, therefor.

In column 1, line 53, delete "(EPIC)" and insert -- (EBIC) --, therefor.

In column 4, line 55, delete "(EPIC)" and insert -- (EBIC) --, therefor.

In column 5, line 18, delete "(EPIC)" and insert -- (EBIC) --, therefor.

Signed and Sealed this

Fourth Day of November, 2008

JON W. DUDAS
*Director of the United States Patent and Trademark Office*